United States Patent [19]
Lee

[11] Patent Number: 5,973,981
[45] Date of Patent: Oct. 26, 1999

[54] STRESS TEST APPARATUS AND METHOD FOR SEMICONDUCTOR MEMORY DEVICE

[75] Inventor: Jae Jin Lee, Ichon, Rep. of Korea

[73] Assignee: Hyundai Electronics Industries Co., Ltd., Kyoungki-do, Rep. of Korea

[21] Appl. No.: 08/966,200

[22] Filed: Nov. 7, 1997

[30] Foreign Application Priority Data

Nov. 8, 1996 [KR] Rep. of Korea ...................... 96-52880

[51] Int. Cl.⁶ ...................................................... G11C 8/00
[52] U.S. Cl. ............... 365/230.01; 365/102; 365/185.17; 365/189.04
[58] Field of Search ............................... 365/203, 63, 201, 365/207, 149, 189.03, 189.04, 194

[56] References Cited

U.S. PATENT DOCUMENTS

| | | | |
|---|---|---|---|
| 5,255,229 | 10/1993 | Tanaka et al. | ........................... 365/201 |
| 5,317,532 | 5/1994 | Ochii . | |
| 5,337,272 | 8/1994 | Suwa et al. | ............................... 365/149 |
| 5,654,925 | 8/1997 | Koh . | |

FOREIGN PATENT DOCUMENTS

0314180 A2  5/1989  European Pat. Off. .

*Primary Examiner*—David Nelms
*Assistant Examiner*—Thong Le
*Attorney, Agent, or Firm*—Gary M. Nath; Nath & Associates

[57] ABSTRACT

A stress test apparatus and method for a semiconductor memory device with a plurality of memory cell arrays. The stress test apparatus comprises a plurality of plate terminals connected to one another, each of the plate terminals being connected to a plurality of storage capacitors, first and second switching elements connected in common to the plate terminals, a plate voltage generator connected to the first switching element, a stress signal generator connected to the second switching element, and a switching control signal generator for generating a switching control signal to control the first and second switching elements. According to the present invention, a cell plate voltage is applied and varied to stress the storage capacitors without driving word lines. Therefore, the storage capacitor stressing operation is simply performed, the stress test time is reduced and the cost is cut down.

3 Claims, 6 Drawing Sheets

STRESS TEST APPARATUS AND METHOD FOR SEMICONDUCTOR MEMORY DEVICE

BACKGROUND OF THE INVENTION

1. Field of the Invention

The present invention relates in general to a stress test apparatus and method for a semiconductor memory device, and more particularly to a stress test apparatus and method in which a cell plate voltage of a dynamic random access memory (referred to hereinafter as DRAM) is applied and varied to stress storage capacitors at the same time and within a short time.

2. Description of the Prior Art

Generally, a stress test operation is for previously removing a chip with a potential fault to prevent an error from occurring when a semiconductor memory device is in use.

In a conventional storage capacitor stressing method, a stress test operation is enabled by fixing a cell plate voltage to half a supply voltage (referred to hereinafter as "half voltage") Vcc/2 and driving a word line. In more detail, in a standby mode, a bit line is precharged with the half voltage Vcc/2, a supply voltage Vcc or a ground voltage Gnd is stored at a storage node, and the half voltage Vcc/2 is applied to a cell plate terminal. If the word line is driven under the above condition, a voltage Vcc/2+ΔV or Vcc/2−ΔV is generated on the bit line and storage node by the charge distribution through a turned-on cell transistor. At this time, the cell plate terminal remains still at the half voltage Vcc/2.

When a sense amplifier is operated, the voltage on the bit line and storage node is changed to the supply voltage Vcc or the ground voltage Gnd, and the cell plate terminal remains still at the half voltage Vcc/2. As a result, in the conventional stressing method, a voltage across a storage capacitor is not more than the half voltage Vcc/2 even though the supply voltage Vcc is raised. Also, the word line must be disabled after being enabled for the stress test operation. In this connection, to stress all cells in the chip, the word line enable/disable operations must be repeated with complexity and inefficiency. Further, in the case where the stress operation is performed with respect to 10 to 100 word lines at a time, a high voltage must be applied to drive the word lines. However, the application of such a high voltage results in a severe damage in cell transistors and storage capacitors. For this reason, it is impossible to make the word line drive voltage high. To the contrary, in the case where a low voltage is applied to drive the word lines, it is impossible to perform the stress test operation through the word lines.

As mentioned above, in the conventional stress test method, much time is required in performing the stress test operation with respect to all the cells in the chip. Also, because the voltage across the storage capacitor has such a small value of Vcc/2 at most, a long stress time is required in removing a fault in the storage capacitor. Further, there is a limitation in increasing the voltage across the storage capacitor.

SUMMARY OF THE INVENTION

Therefore, the present invention has been made in view of the above problems, and it is an object of the present invention to provide a stress test apparatus and method for a semiconductor memory device in which a cell plate voltage is applied and varied to stress storage capacitors without driving word lines, so as to reduce a stress test time of a chip.

In accordance with one aspect of the present invention, there is provided a stress test apparatus for a semiconductor memory device with a plurality of memory cell arrays, comprising a plurality of plate terminals connected to one another, each of the plate terminals being connected to a plurality of storage capacitors; first and second switching means connected in common to the plate terminals; plate voltage generation means connected to the first switching means; stress signal generation means connected to the second switching means; and switching control signal generation means for generating a switching control signal to control the first and second switching means.

In accordance with another aspect of the present invention, there is provided a stress test method for a semiconductor memory device with a plurality of memory cell arrays, comprising the first step of applying half a supply voltage to cell plate terminals in a normal mode; the second step of applying a stress test signal to the cell plate terminals in a stress test mode; and the third step of generating a control signal to control the normal and stress test modes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
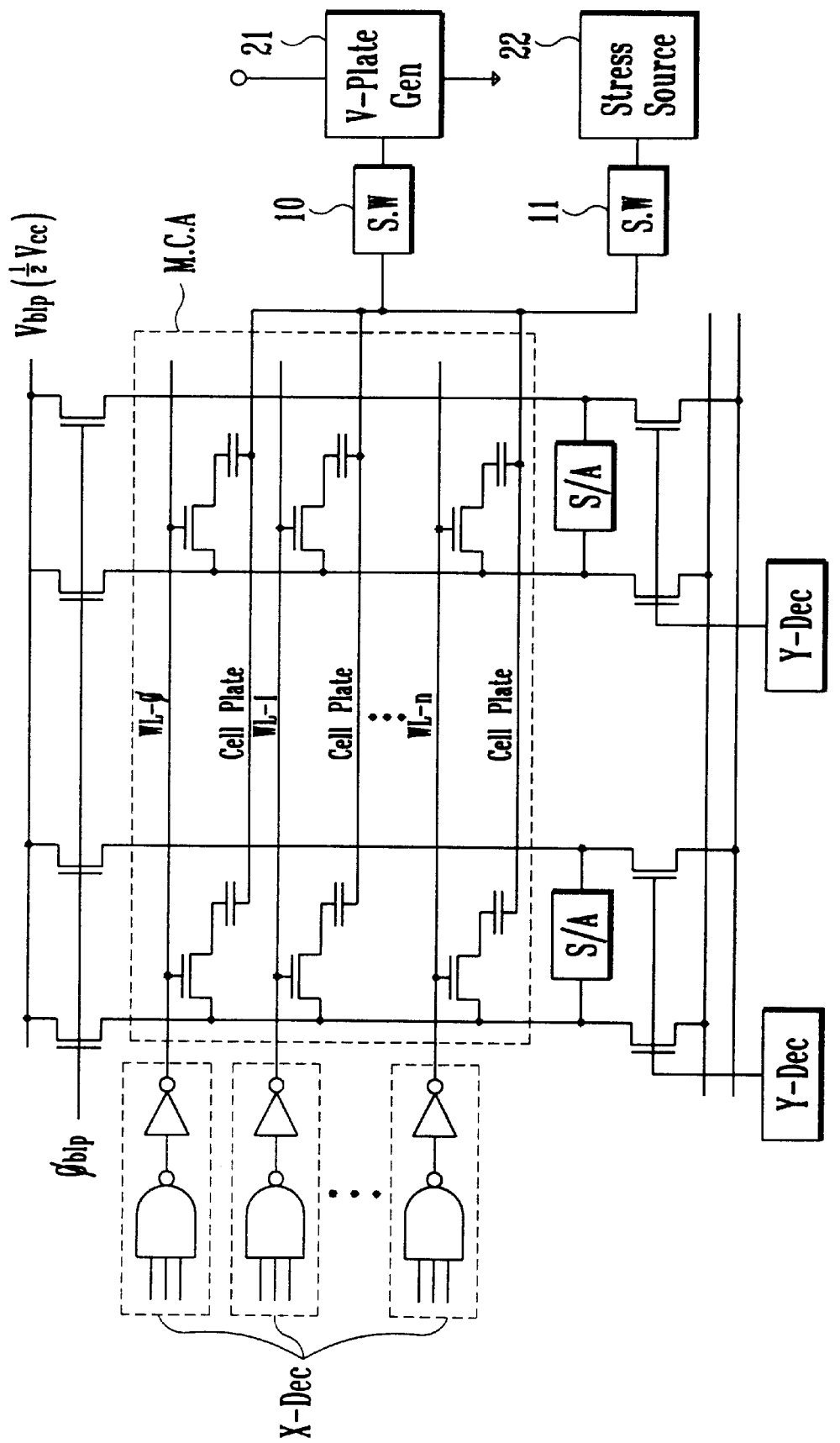
FIG. 1 is a schematic view showing one example of a semiconductor memory device to which the present invention is applied.

FIG. 1 is a schematic view showing one example of a semiconductor memory device to which the present invention is applied. As shown in this drawing, cell capacitors are connected to one another through cell plate terminals. First and second switching elements 10 and 11 are connected respectively to a common connection point of the cell plate terminals. A plate voltage generator 21 is connected to the first switching element 10, and a stress signal generator 22 is connected to the second switching element 11.

The operation of the present invention will hereinafter be described briefly.

In a normal mode, the first switching element 10 is turned on to transfer a half voltage Vcc/2 generated by the plate voltage generator 21 to the cell plate terminals, and the second switching element 11 is turned off. In a stress test mode, the first switching element 10 is turned off, and the second switching element 11 is turned on to transfer a stress signal generated by the stress signal generator 22 to the cell plate terminals. As a result, a stress test operation is performed.

As mentioned above, in accordance with the present invention, because the cell capacitors are connected to one another through the cell plate terminals, the stress test apparatus can stress a large number of cells at a time without accessing them one by one, by varying the voltage to the cell plate terminals.

Figure 2:
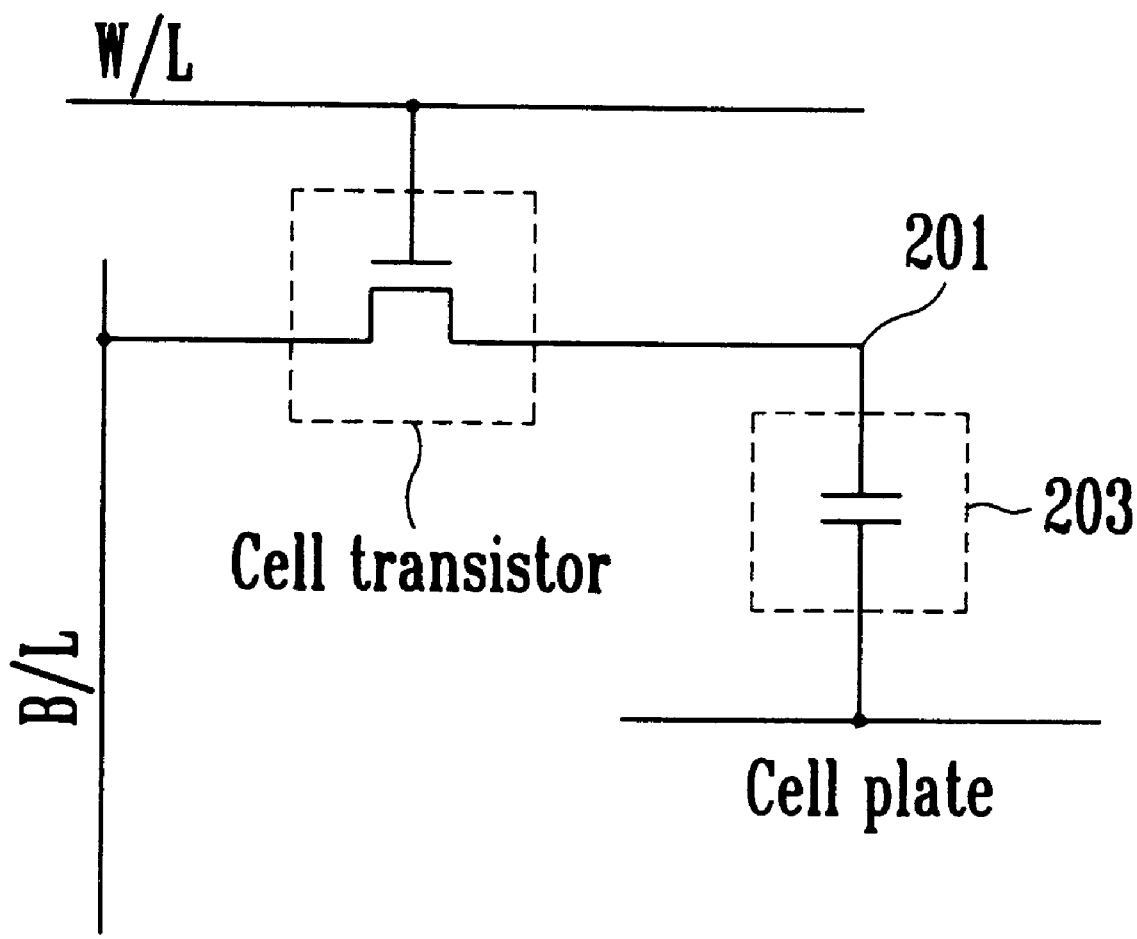
FIG. 2 is a circuit diagram of a general memory cell.

FIG. 2 is a circuit diagram of a general memory cell. In a standby mode, a bit B/L line is precharged with a half voltage Vcc/2, a supply voltage Vcc or a ground voltage Gnd is stored at a storage node 201, and the half voltage Vcc/2 is applied to a cell plate terminal.

If a word line W/L is driven under the above condition, a voltage Vcc/2+ΔV or Vcc/2−ΔV is generated on the bit line B/L and storage node 201 by the charge distribution. At this time, the cell plate terminal remains still at the half voltage Vcc/2. Then, when a sense amplifier is operated, the voltage on the bit line B/L and storage node 201 is amplified to the supply voltage Vcc or the ground voltage Gnd, and the cell plate terminal remains still at the half voltage Vcc/2. As a result, in a conventional storage capacitor stressing method, a voltage across a storage capacitor 203 is not more than the half voltage Vcc/2 even though the supply voltage Vcc is raised. Also, the above-mentioned operation must be repeated with respect to all cells in the chip to stress them.

Figure 3:
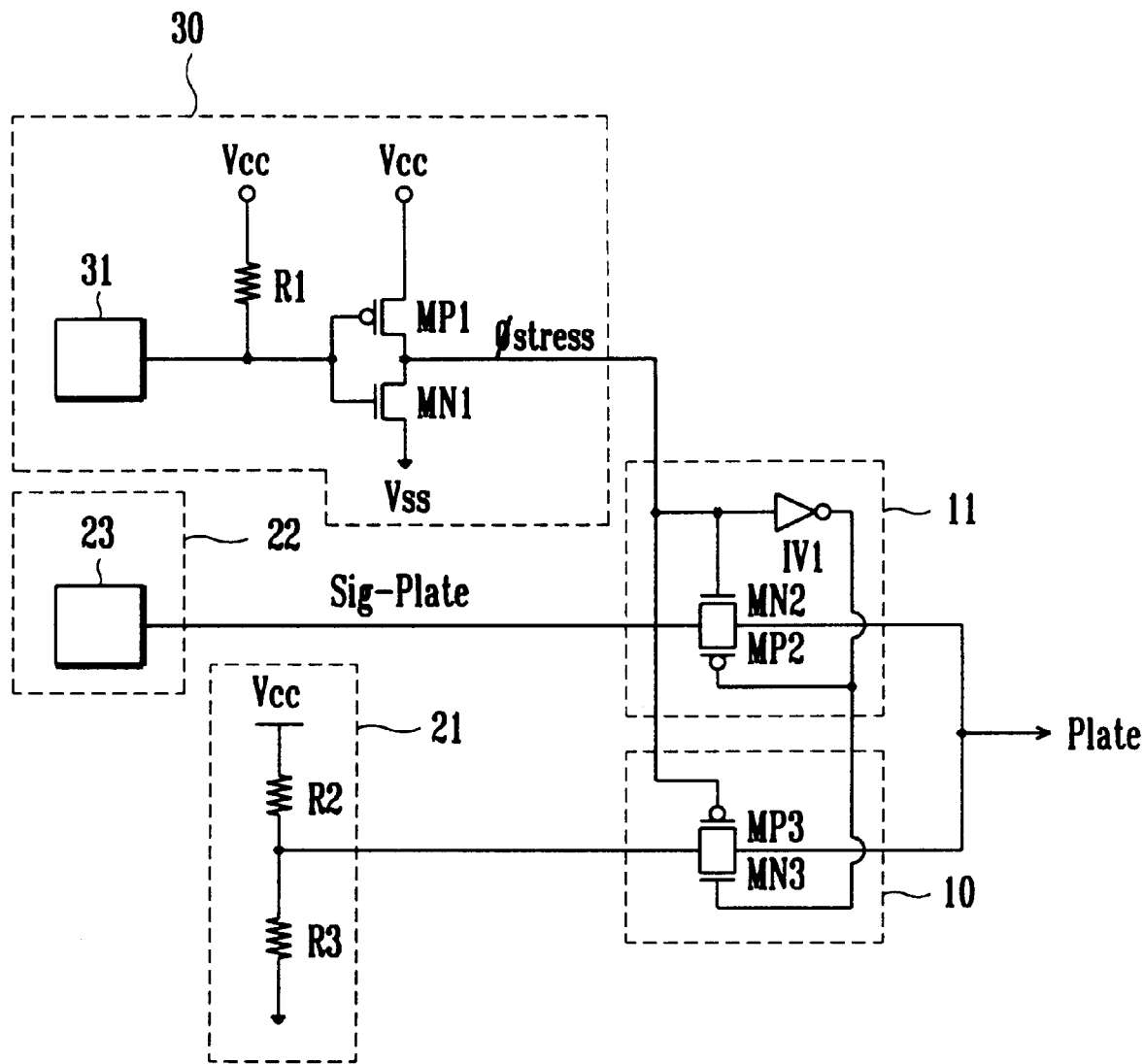
FIG. 3 is a detailed circuit diagram of a stress test apparatus in accordance with an embodiment of the present invention.

FIG. 3 is a detailed circuit diagram of a stress test apparatus in accordance with an embodiment of the present invention. The plate voltage generator 21 is adapted to apply the half voltage Vcc/2 to the first switching element 10 in the normal mode. The first switching element 10 is adapted to transfer the half voltage Vcc/2 generated by the plate voltage generator 21 to the cell plate terminals in the normal mode. The stress signal generator 22 is adapted to apply the stress signal to the second switching element 11 in the stress test mode. The second switching element 11 is adapted to transfer the stress signal generated by the stress signal generator 22 to the cell plate terminals in the stress test mode. A switching control signal generator 30 is adapted to generate a switching control signal φStress to control the first and second switching elements 10 and 11 in the normal and stress test modes.

The plate voltage generator 21 includes a second resistor R2 connected between a supply voltage terminal and an output terminal of the plate voltage generator 21, and a third resistor R3 connected between the output terminal of the plate voltage generator 21 and a ground voltage terminal.

The first switching element 10 includes a third PMOS transistor MP3 having its gate terminal for inputting the switching control signal φStress from the switching control signal generator 30, its source terminal connected to the output terminal of the plate voltage generator 21 and its drain terminal connected to the cell plate terminals, and a third NMOS transistor MN3 having its gate terminal for inputting an inverted one of the switching control signal φStress from the switching control signal generator 30, its drain terminal connected to the output terminal of the plate voltage generator 21 and its source terminal connected to the cell plate terminals.

The second switching element 11 includes a second NMOS transistor MN2 having its gate terminal for inputting the switching control signal φStress from the switching control signal generator 30, its drain terminal connected to an output terminal of the stress signal generator 22 and its source terminal connected to the cell plate terminals, a first inverter IV1 for inverting the switching control signal φStress from the switching control signal generator 30, and a second PMOS transistor MP2 having its gate terminal for inputting an output signal from the first inverter IV1, its source terminal connected to the output terminal of the stress signal generator 22 and its drain terminal connected to the cell plate terminals.

The stress signal generator 22 is provided with a stressing pad 23 formed on a silicon wafer for receiving an external input signal. Alternatively, the stress signal generator 22 may include a ring oscillator for generating an internal signal.

The switching control signal generator 30 includes a stress test signalling pad 31, a first resistor R1 connected between the supply voltage terminal and an output terminal of the stress test signalling pad 31, a first PMOS transistor MP1 connected between the supply voltage terminal and an output terminal of the switching control signal generator 30, and a first NMOS transistor MN1 connected between the output terminal of the switching control signal generator 30 and the ground voltage terminal. The first PMOS and NMOS transistors MP1 and MN1 have their gate terminals connected in common to the output terminal of the stress test signalling pad 31.

The operation of the stress test apparatus with the above-mentioned construction in accordance with the embodiment of the present invention will hereinafter be described in detail.

In the normal mode, the switching control signal φStress from the switching control signal generator 30 becomes low in logic, thereby causing the first switching element 10 to be turned on and the second switching element 11 to be turned off. As a result, the half voltage Vcc/2 generated by the plate voltage generator 21 is transferred to the cell plate terminals.

In the stress test mode, the switching control signal φStress from the switching control signal generator 30 becomes high in logic, thereby causing the first switching element 10 to be turned off and the second switching element 11 to be turned on. As a result, the stress signal generated by the plate voltage generator 21 is transferred to the cell plate terminals so that the cell plate voltage can be changed to Vcc - Gnd - Vcc. At this time, the stress test operation is performed with respect to all cells connected to the same plate terminal.

Figure 4:
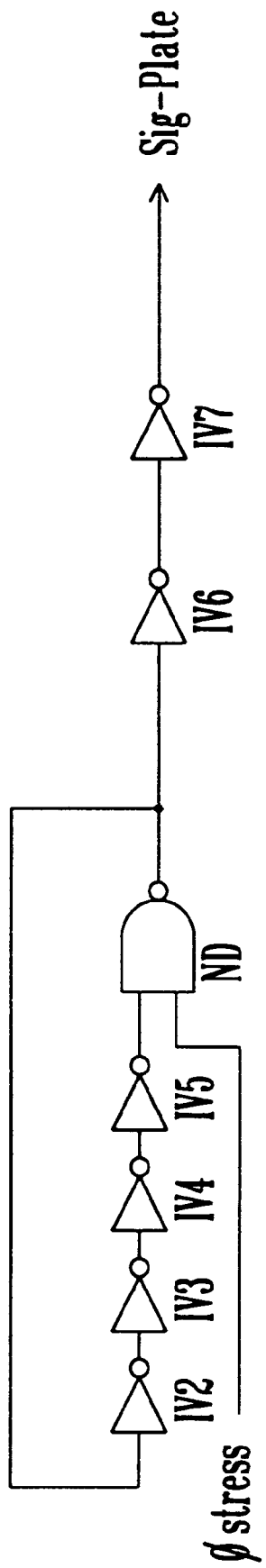
FIG. 4 is a detailed circuit diagram of an alternative embodiment of a stress signal generator in FIG. 3.

FIG. 4 is a detailed circuit diagram of an alternative embodiment of the stress signal generator 22 in FIG. 3. In accordance with the alternative embodiment of the present invention, the stress signal generator 22 includes a ring oscillator for generating an internal signal. As shown in FIG. 4, the ring oscillator includes a NAND gate ND for NAND-ing a delayed signal and the switching control signal φStress from the switching control signal generator 30, second to fifth inverters IV2–IV5 connected in series to the NAND gate ND for delaying an output signal from the NAND gate ND for a predetermined time period and outputting the delayed signal to the NAND gate ND, a sixth inverter IV6 for inverting the output signal from the NAND gate ND, and a seventh inverter IV7 for inverting an output signal from the sixth inverter IV6 and outputting the inverted signal as the stress signal.

With this construction, the ring oscillator generates the stress signal of a desired period in response to the switching control signal φStress from the switching control signal generator 30.

Figure 5:
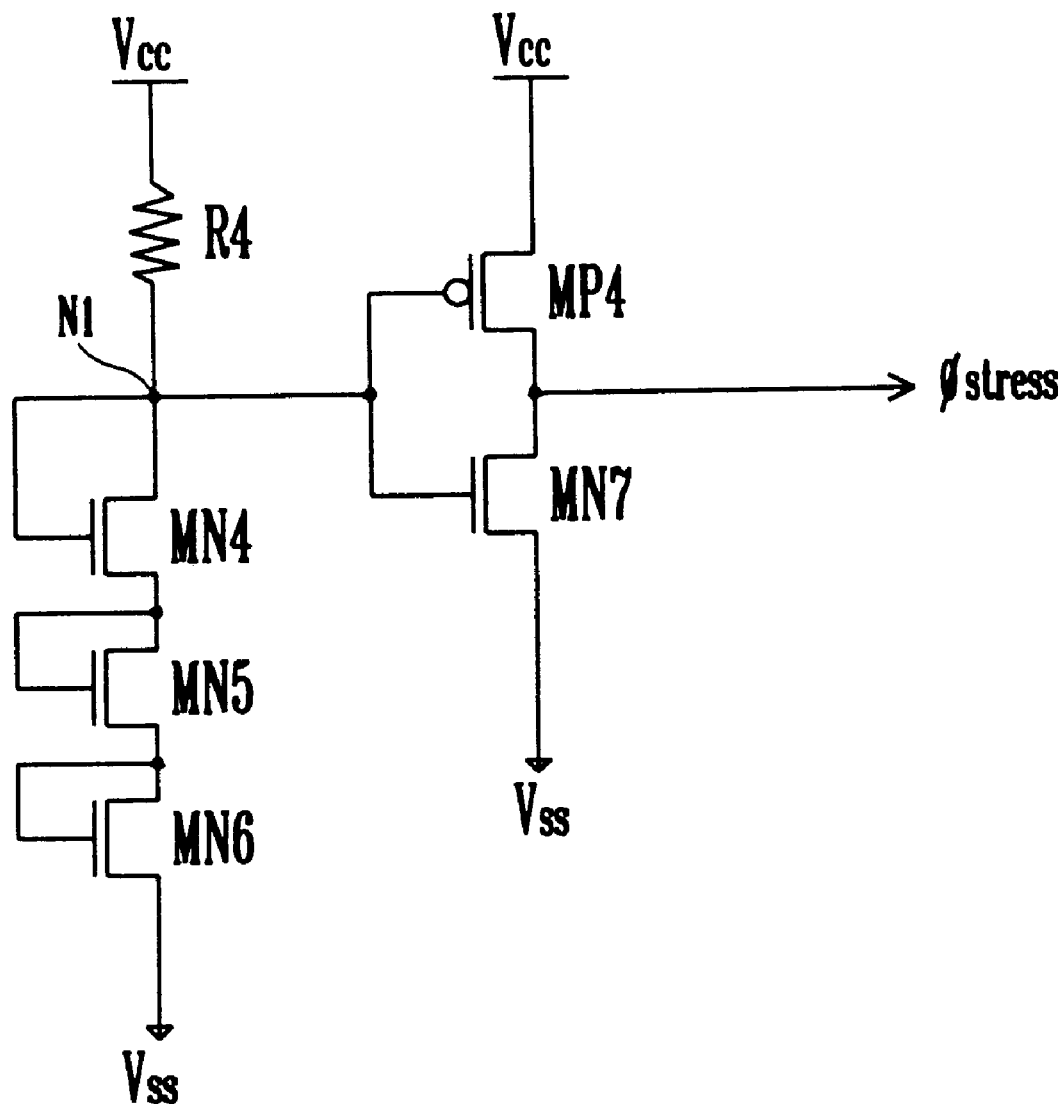
FIG. 5 is a detailed circuit diagram of an alternative embodiment of a switching control signal generator in FIG. 3.

FIG. 5 is a detailed circuit diagram of an alternative embodiment of the switching control signal generator 30 in FIG. 3. In accordance with the alternative embodiment of the present invention, the switching control signal generator 30 has a function of sensing a value of the supply voltage Vcc higher than a predetermined value. As shown in FIG. 5, the switching control signal generator 30 includes a fourth resistor R4 connected between the supply voltage terminal and a first node N1, and fourth to sixth NMOS transistors MN4–MN6 connected in series between the first node N1 and the ground voltage terminal. The fourth NMOS transistor MN4 has its gate and drain terminals connected in common to the first node N1, the fifth NMOS transistor MN5 has its gate and drain terminals connected in common to a source terminal of the fourth NMOS transistor MN4, and the sixth NMOS transistor MN6 has its gate and drain terminals connected in common to a source terminal of the fifth NMOS transistor MN5 and its source terminal connected to the ground voltage terminal. The switching control signal generator 30 further includes a fourth PMOS transistor MP4 connected between the supply voltage terminal and the output terminal of the switching control signal generator 30, and a seventh NMOS transistor MN7 connected between the output terminal of the switching control signal generator 30 and the ground voltage terminal. The fourth PMOS and seventh NMOS transistors MP4 and MN7 have their gate terminals connected in common to the first node N1.

The operation of the switching control signal generator 30 with the above-mentioned construction in accordance with the alternative embodiment of the present invention will hereinafter be described in detail.

Assuming that the fourth PMOS and seventh NMOS transistors MP4 and MN7 are the same in size, they will be turned on in response to about the half voltage Vcc/2. In this connection, in the case where the supply voltage Vcc is high, the fourth PMOS transistor MP4 is turned on to make the switching control signal φStress high in logic. As a result, the stress test operation is performed. However, in the case where the supply voltage Vcc is low, the seventh NMOS transistor MN7 is turned on to make the switching control signal φStress low in logic. As a result, the normal operation is performed.

Figure 6:
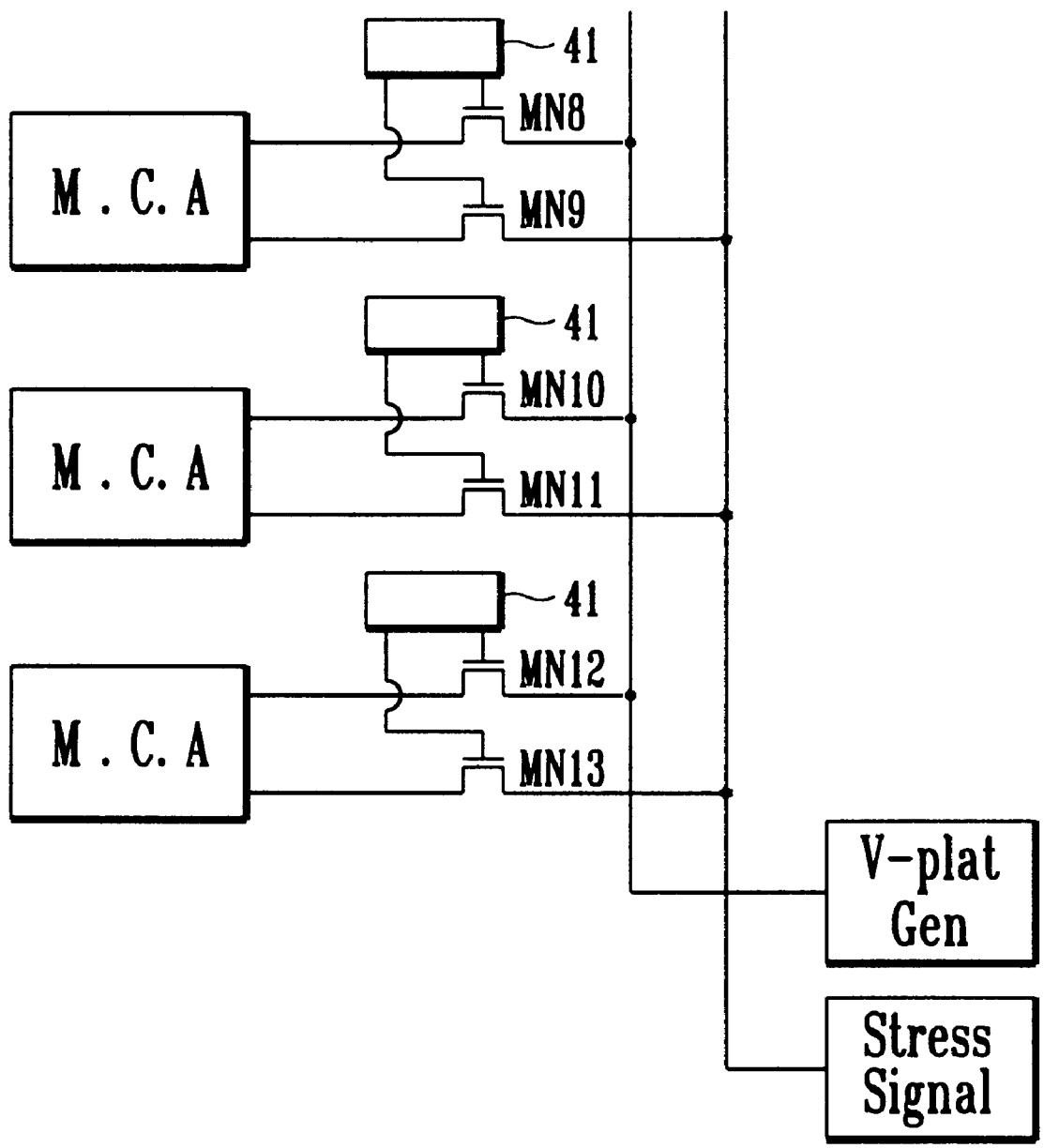
FIG. 6 is a schematic view showing another example of a semiconductor memory device to which the present invention is applied.

FIG. 6 is a schematic view showing another example of a semiconductor memory device to which the present invention is applied. Memory cell arrays M.C.A are distinguished from one another by an address signal and a desired one thereof is selectively operable. To this end, a switching element is connected between the corresponding memory cell array M.C.A and the plate voltage generator 21, another switching element is connected between the corresponding memory array M.C.A and the stress signal generator 21, and a controller controls the switching elements.

As apparent from the above description, according to the present invention, the storage capacitor stressing operation is simply performed, the stress test time is reduced and the cost is cut down.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A stress test apparatus for a semiconductor memory device with a plurality of memory cell arrays, comprising:

a plurality of cell plate terminals connected to one another, each of said plate terminals being connected to a plurality of storage capacitors;

first and second switching means connected in common to said plate terminals;

plate voltage generation means connected to said first switching means;

stress signal generation means connected to said second switching means; and switching control signal generator means for generating a switching control signal to control said first and second switching means, wherein said stress signal generation means includes a ring oscillator having a logic gate for logically combining a delayed signal and said switching control signal from said switching control signal generation means.

2. A stress test apparatus for a semiconductor memory device, as set forth in claim 1, wherein said ring oscillator further includes a plurality of inverters connected in series to said logic gate for delaying an output signal from said logic gate for a predetermined time period and outputting the delayed signal to said logic gate.

3. A stress test apparatus for a semiconductor memory device, as set forth in claim 1, wherein said logic gate is a NAND gate.

* * * * *